United States Patent
Lo et al.

(10) Patent No.: US 8,479,137 B2
(45) Date of Patent: Jul. 2, 2013

(54) APPARATUS AND METHOD FOR PREVENTING CONGESTIVE PLACEMENT

(75) Inventors: Chen-Hsing Lo, Hsinchu Hsien (TW); Chien-Pang Lu, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 13/040,512

(22) Filed: Mar. 4, 2011

(65) Prior Publication Data
US 2011/0219346 A1 Sep. 8, 2011

(30) Foreign Application Priority Data
Mar. 8, 2010 (TW) .............................. 99106590 A (51) Int. Cl.
*G06F 17/50* (2006.01)
(52) U.S. Cl.
USPC ........... 716/123; 716/118; 716/122; 716/126; 716/130; 716/135
(58) Field of Classification Search
USPC .......................... 716/111–114, 118–131, 135
See application file for complete search history.

(56) References Cited

U.S. PATENT DOCUMENTS

| 7,739,644 B1 * | 6/2010 | Chong et al. ................... 716/119 |
| 7,930,668 B1 * | 4/2011 | Parsa ............................. 716/126 |
| 2007/0079273 A1 * | 4/2007 | Lahner et al. .................... 716/10 |
| 2009/0187870 A1 * | 7/2009 | Yifrach et al. ..................... 716/9 |
| 2009/0210834 A1 * | 8/2009 | Chadwick et al. ................ 716/5 |

* cited by examiner

*Primary Examiner* — Nha Nguyen
(74) *Attorney, Agent, or Firm* — Edell, Shapiro & Finnan, LLC (57) ABSTRACT

A congestive placement preventing apparatus for modifying a circuit layout includes an analyzing module, a defining module and an extension module. The analyzing module performs a congestion analysis on the circuit layout to generate an analysis result. The defining module defines a congestion region and a share region adjacent to the congestion region on the circuit layout according to the analysis result. A density of electronic cells of the congestion region is higher than that of electronic cells of the share region. The extension module arranges a plurality of electronic cells in the congestion region to the congestion region and the share region, thereby reducing the density of electronic cells in the congestion region.

12 Claims, 10 Drawing Sheets

APPARATUS AND METHOD FOR PREVENTING CONGESTIVE PLACEMENT

CROSS REFERENCE TO RELATED PATENT APPLICATION

This patent application is based on Taiwan, R.O.C. patent application No. 99106590 filed on Mar. 8, 2010.

FIELD OF THE INVENTION

The present invention relates to a circuit layout, and more particularly, to a congestive placement preventing apparatus and method thereof capable of extending electronic cells in a congestion region of the circuit layout to an adjacent region comprising electronic cells having a relatively lower density thus reducing a density of electronic cells of the congestion region thereby changing the un-routable congestion region to a routable region.

BACKGROUND OF THE INVENTION

As electronic technology continuously develops, various types of electronic products become thinner and smaller and have more and more functions. Therefore, the increasingly smaller size of a chip needs to accommodate an increasing amount of types of electronic cells to meet practical requirements of electronic products.

However, in some circuit layouts, since there are too many electronic cells in a region, i.e., a density of electronic cells of the region is too large, and routing among electronic cells in the region becomes difficult to perform thereby causing failure in design rule checking, such that the circuit layouts cannot be normally performed.

Figure 1A:
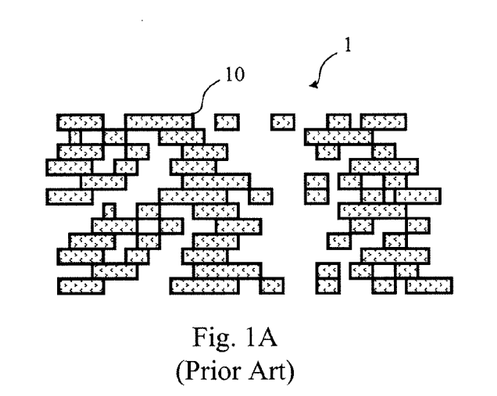
FIG. 1A and FIG. 1B are schematic diagrams of a circuit layout comprising electronic cells with a density of 75% in the prior art.
Figure 1B:
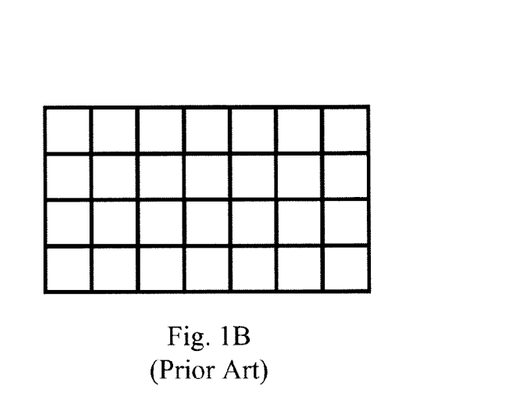

FIG. 1A and FIG. 1B show schematic diagrams of a circuit layout comprising electronic cells with a density of 75%. Since electronic cells 10 on a circuit layout 1 are not compactly arranged, i.e., there still are routing spaces among the electronic cells 10, there is no un-routable congestion region on the circuit layout 1.

Figure 1C:
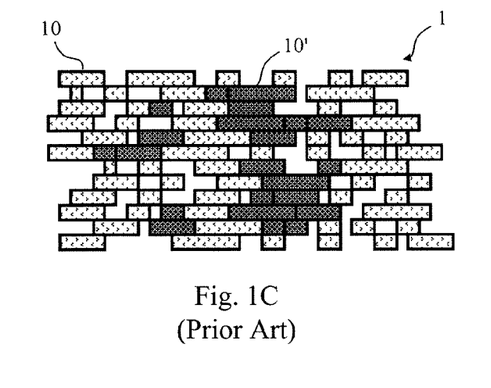
FIG. 1C and FIG. 1D are schematic diagrams of a circuit layout comprising electronic cells with a density of 90% in the prior art.
Figure 1D:
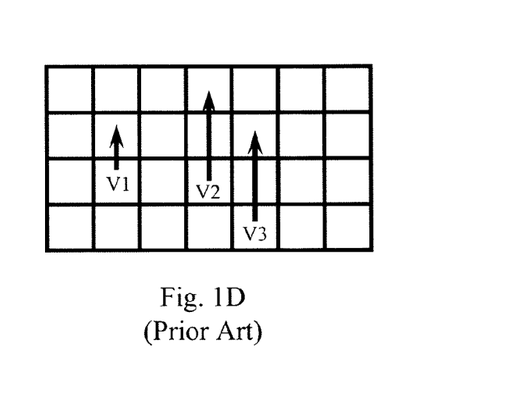

However, when the density of electronic cells on the circuit layout 1 becomes higher, the foregoing situation changes. FIG. 1C and FIG. 1D show schematic diagrams of the circuit layout 1 comprising electronic cells with the density increased to 90%. Since electronic cells 10' are inserted into many routing spaces of the circuit layout 1 shown in FIG. 1A, a plurality of un-routable congestion regions emerge on the circuit layout 1 as shown in FIG. 1C. Congestion state marks $V_1$ to $V_3$ (i.e., arrows) represent the congestion regions in a vertical direction of the circuit layout 1 in FIG. 1D.

Since the types and the number of electronic cells contained in a circuit layout continue to increase consistent with the development of technologies and practical applications, the congestion problem described above becomes increasingly serious. Conventional solutions for the foregoing problem may cause variations of relative positions of the electronic cells on the circuit layout such that the circuit layout cannot satisfy a time constraint or results in sacrificing partial spaces of the circuit layout thereby creating additional area penalty.

Therefore, one main object of the present invention is to provide a congestive placement preventing apparatus and method thereof to solve the foregoing problem.

SUMMARY OF THE INVENTION

According to a first embodiment of the present invention, a congestive placement preventing apparatus, applied to a circuit layout, comprises an analysis module, a defining module, and an extension module. The analysis module performs a congestion analysis on the circuit layout to generate an analysis result. The defining module defines a congestion region and a share region adjacent to the congestion region on the circuit layout according to the analysis layout. A density of electronic cells in the congestion region is higher than that of electronic cells in the share region. The extension module arranges the electronic cells in the congestion region to the congestion region and the share region.

According to a second embodiment of the present invention, a congestive placement preventing method, applied to a circuit layout, comprises steps of performing a congestion analysis on the circuit layout to generate an analysis result; defining a congestion region and a share region adjacent to the congestion region on the circuit layout according to the analysis result; and arranging electronic cells in the congestion region to the congestion region and the share region or area, wherein a density of electronic cells in the congestion region is higher than that of electronic cells in the share region.

Compared to the prior art, a congestive placement preventing apparatus and method thereof provided by the present invention is capable of extending electronic cells in a congestion region of the circuit layout to an adjacent region comprising electronic cells having a relatively lower density to reduce a density of electronic cells in the congestion region thereby changing an un-routable congestion region to a routable region. Furthermore, the densities of electronic cells in the congestion region and the share region become more uniform.

In addition, due to processing of the congestive placement preventing apparatus and method thereof provided by the present invention, relative positions of the electronic cells on the circuit layout remain unchanged, so that the circuit layout can satisfy pre-existing time constraints. Moreover, for the circuit layout, no additional area penalty is generated to remove the congestion region.

The advantages and spirit related to the present invention can be further understood via the following detailed description and drawings.

DETAILED DESCRIPTION OF THE PREFERRED EMBODIMENT

According to a first embodiment of the present invention, a congestive placement preventing apparatus is applied to a circuit layout comprising a plurality of electronic cells. The types and the number of the electronic cells and connecting relationships among the electronic cells are not limited and are determined according to practical requirements.

Figure 2:
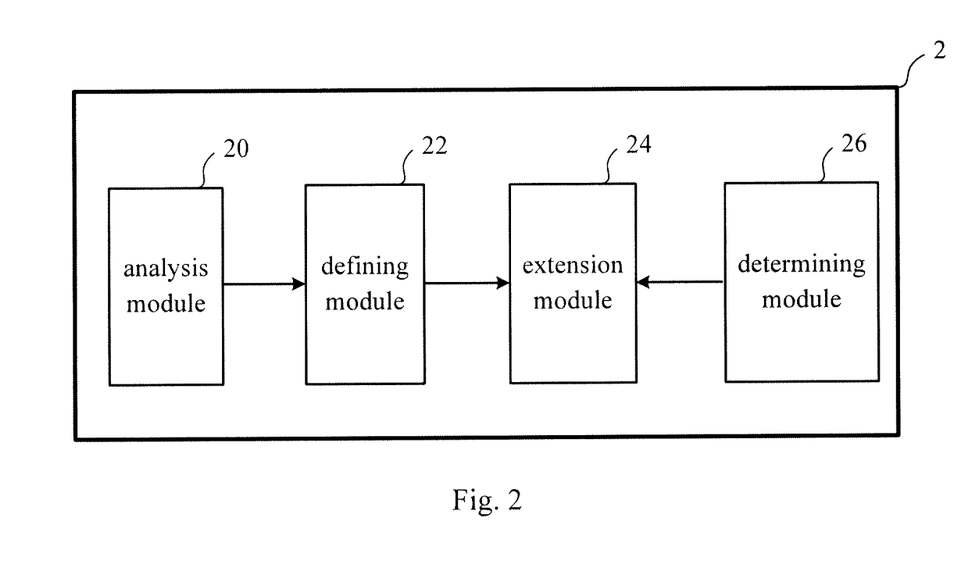
FIG. 2 shows a function block diagram of a congestive placement preventing apparatus in accordance with a first embodiment of the present invention.

FIG. 2 shows a function block diagram of a congestive placement preventing apparatus applied to a circuit layout in accordance with the first embodiment of the present invention. A congestive placement preventing apparatus 2 comprises an analysis module 20, a defining module 22, an extension module 24, and a determining module 26. Modules and functions of the modules of the congestive placement preventing apparatus 2 are described below.

In this embodiment, the analysis module 20 mainly performs a routing congestion analysis on the circuit layout to generate an analysis result. In practice, the analysis module 20 analyzes whether densities of electronic cells in regions of the circuit layout are higher than a predetermined value to generate an analysis result associated with routing congestion situations of the regions. For example, the analysis result may be similar to that illustrated in FIG. 1A to FIG. 1D; however, such a result should not be construed as limiting the present invention.

The defining module 22 defines on the circuit layout a congestion region comprising electronic cells having a relatively high density, and a share region, adjacent to the congestion region, comprising electronic cells having a relatively low density according to the analysis result obtained by the analysis module 20. The extension module 24 re-arranges the electronic cells that are originally distributed in the congestion region, so that the electronic cells are extended to the congestion region and the share region.

Figure 3A:
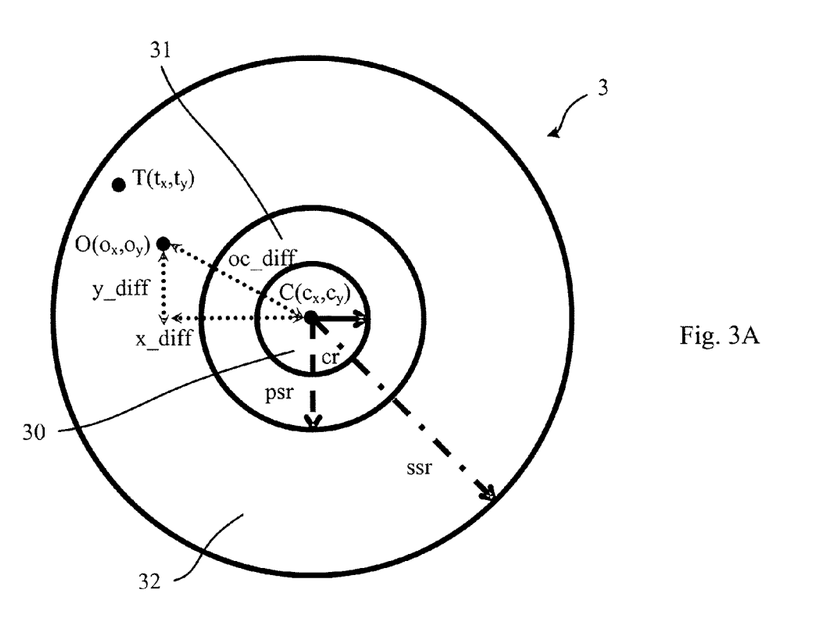
FIG. 3A is a schematic diagram of a definition of a congestion region and a share region on a circuit layout according to an analysis result.

For example, referring to FIG. 3A, supposing that the analysis result obtained by the analysis module 20 is that a density of electronic cells in a region 30 of a circuit layout 3 is high, the defining module 22 defines the region 30 of the circuit layout 3 as a congestion region according to the analysis result, and further defines regions 31 and 32 adjacent to the congestion region 30 as a first share region 31 and a second share region 32. The first share region 31 is nearer to the congestion region 30, and the second share region 32 is on the outer side of the first share region 31.

It is to be noted that, in this embodiment, the congestion region 30, the first share region 31 and the second share region 32 are circles. However, in practical applications, forms or shapes of the congestion region and the share region on the circuit layout can be determined according to an aspect ratio factor. Therefore, a user can change forms of the congestion region and the share region by defining different aspect ratio factors, e.g., square, rectangle, ellipse, and the like. In addition, the number of the congestion regions and share regions on the circuit layout 3 defined by the defining module 22 is determined according to the practical analysis of the analysis module 20.

As shown in FIG. 3A, the congestion region 30, the first share region 31 and the second share region 32 on the circuit layout 3 form concentric circles from the inside out by regarding a point $C(c_x, c_y)$ as a center. The congestion region 30 has a radius cr, the first share region 31 has a radius psr, and the second share region 32 has a radius ssr, where ssr>psr>cr. Suppose that an original position of an electronic cell on the circuit layout 3 is $O(o_x, o_y)$, oc_diff is a distance between $O(o_x, o_y)$ and $C(c_x, C_y)$, x_diff is a horizontal component of oc_diff, and y_diff is a vertical component of oc_diff.

Figure 3B:
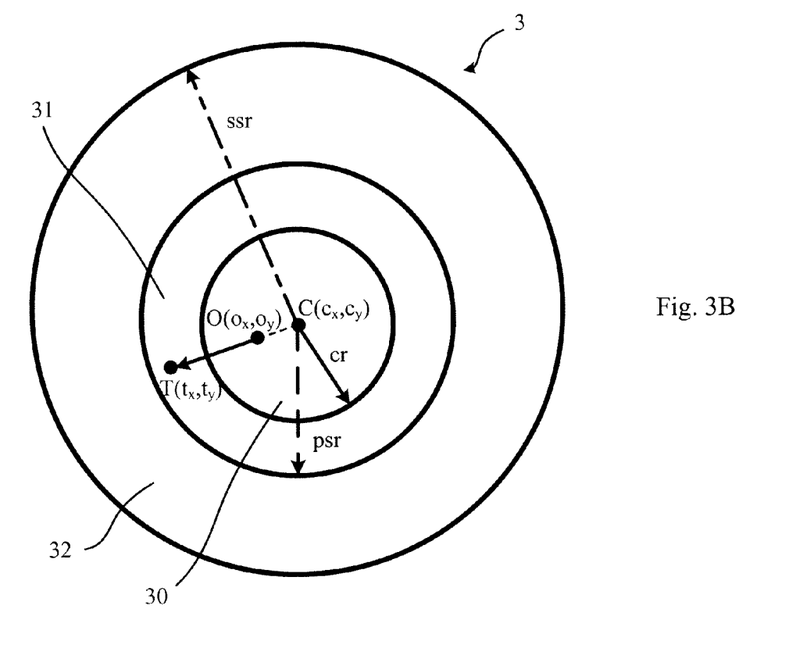
FIG. 3B and FIG. 4A to FIG. 4C are schematic diagrams of movement of electronic cells on a circuit layout from an original position O to T.

Referring to FIG. 3B, when the original position $O(o_x, o_y)$ of the electronic cell is in the congestion region 30, the electronic cell is moved by the extension module 24 to a position $T(t_x, t_y)$, which is limited to a range of the congestion region 30 and the first share region 31 and is calculated via Equation 1 to Equation 3:

$$sca\_fac = psr/cr \qquad \text{(Equation 1)}$$

$$t_x = c_x + (x\_diff * sca\_fac) \qquad \text{(Equation 2)}$$

$$t_y = c_y + (y\_diff * sca\_fac) \qquad \text{(Equation 3)}$$

The extension ratio sca_fac of Equation 1 is a ratio between the radius psr of the first share region 31 and the radius cr of the congestion region 30, i.e., the extension ratio sca_fac is a ratio between a distance between the center point C and a boundary of the congestion region 30 and a distance between the center point C of the congestion region 30 and a boundary of the first share region 31.

Figure 4A:
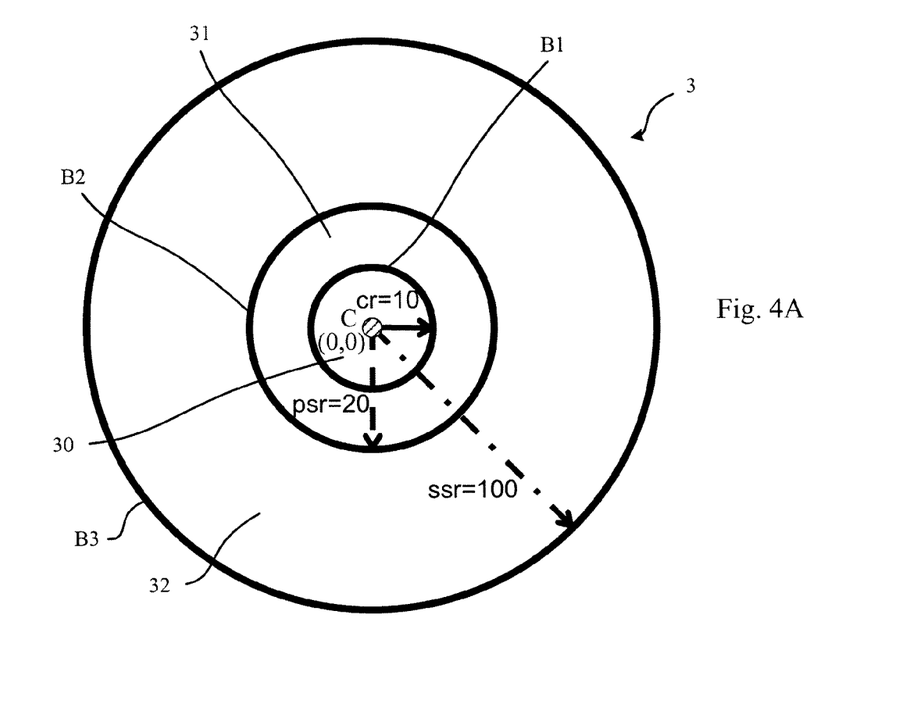
Figure 4B:
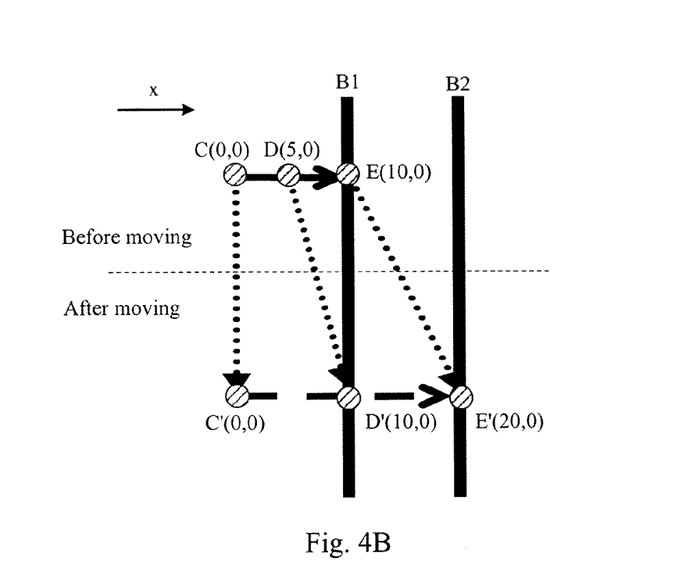

For example, referring to FIG. 4A and FIG. 4B, suppose that cr=10, psr=20, ssr=100, and boundaries (i.e., circumferences) of the congestion region 30, the first share region 31 and the second share region 32 are respectively represented by B1, B2 and B3. When to-be-moved electronic cells are respectively on positions C(0, 0), D(5, 0) and E(10, 0) of the congestion region 30, according to Equation 1 and Equation 2, it is calculated that the electronic cells are moved to positions C'(0, 0), D'(10, 0) and E'(20, 0).

That is, the extension module 24 re-arranges the electronic cells in the congestion region 30 to ranges of the congestion region 30 and the first share region 31 according to a value associated with the ratio psr/cr to enlarge distances among the electronic cells, so that distribution of the electronic cells becomes discrete thereby significantly reducing a density of the electronic cells in the congestion region 30.

Likewise, when the original position $O(o_x, o_y)$ of the electronic cell is in the first share region or the second share region, the position $T(t_x, t_y)$ where the electronic cell is moved by the extension module 24 is limited to the range of the second share region 32. The coordinate of the position $T(t_x, t_y)$ is calculated via Equation 4 to Equation 6:

$$sca\_fac = psr + ((oc\_diff - cr) * (ssr - psr)/(ssr - cr)) \qquad \text{(Equation 4)}$$

$$t_x = c_x + (x\_diff * sca\_fac/oc\_diff) \qquad \text{(Equation 5)}$$

$$t_y = c_y + (y\_diff * sca\_fac/oc\_diff) \qquad \text{(Equation 6)}$$

The extension ratio sca_fac of Equation 4 is associated with a distance between the center point C of the congestion region 30 and the boundary B3 of the second share region 32 (i.e., the radius ssr of the second share region 32), a distance between the center point C of the congestion region 30 and the boundary B2 of the first share region 31 (i.e., the radius psr of the first share region 31), a distance between the center point C and the boundary B1 of the congestion region 30 (i.e., the radius cr of the congestion region), and a distance between the center point of the congestion region 30 and the original position O of the electronic cell. More specifically, the extension ratio sca_fac of Equation 4 is associated with a ratio between the second share region 32 and the overall range of the first share region 31 and the second share region 32.

Figure 4C:
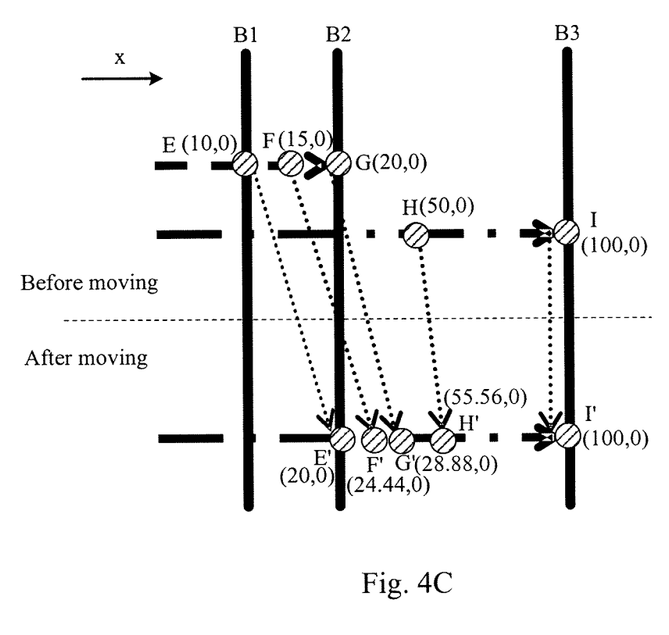

Referring to FIG. 4A and FIG. 4C, when the to-be-moved electronic cells are on positions E(10, 0), F(15, 0), G(20, 0) H(50, 0) and I(100, 0) in the first share region 31 or the second share region 32, according to Equation 4 to Equation 6, it is calculated that the electronic cells are moved to positions E'(20, 0), F'(24.44, 0), G'(28.88, 0), H'(55.56, 0) and I'(100, 0) in the second share region 32.

That is, when the electronic cells originally distributed in the first share region 31 or the second share region 32 are moved by the extension module 24, the extension module 24 enlarges distances among the electronic cells according to a value associated with the ratio sca_fac/oc_diff, so that the electronic cells originally distributed in the first share region 31 are moved to the second share region 32 having a larger range to avoid significant increase of the density of electronic cells in the first share region 31 since electronic cells are moved from the congestion region 30 to the first share region 31.

Figure 5A:
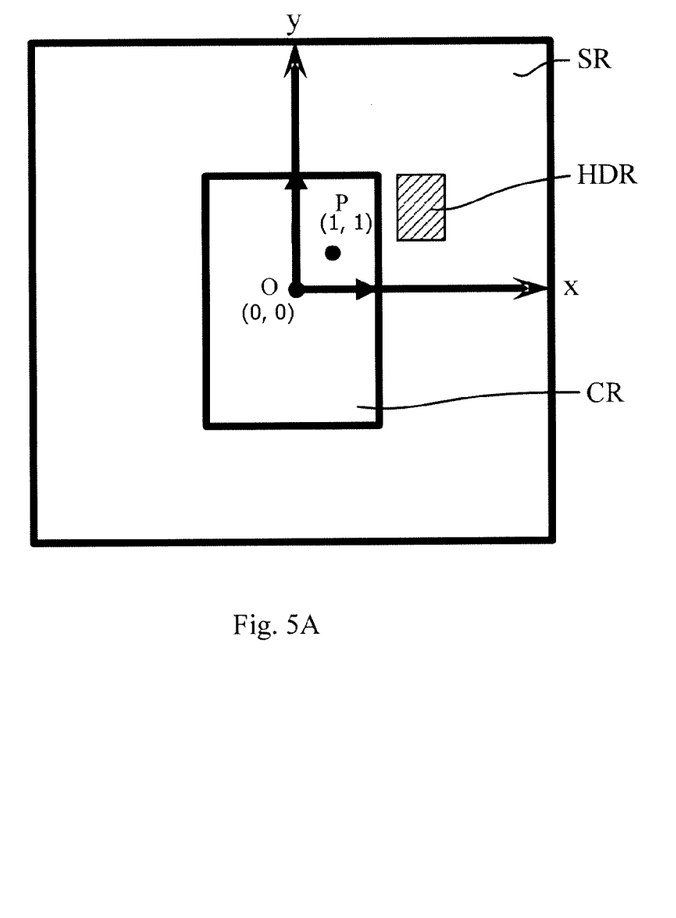
FIGS. 5A to 5C are schematic diagrams of processing performed when positions of electronic cells moved by an extension module are within a region having a high density of electronic cells.
Figure 5B:
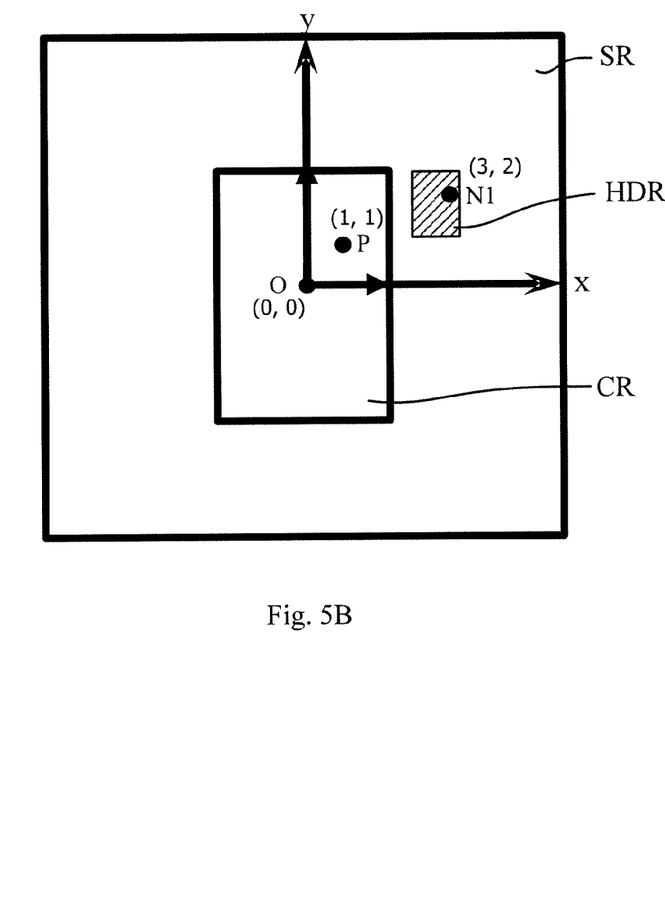
Figure 5C:
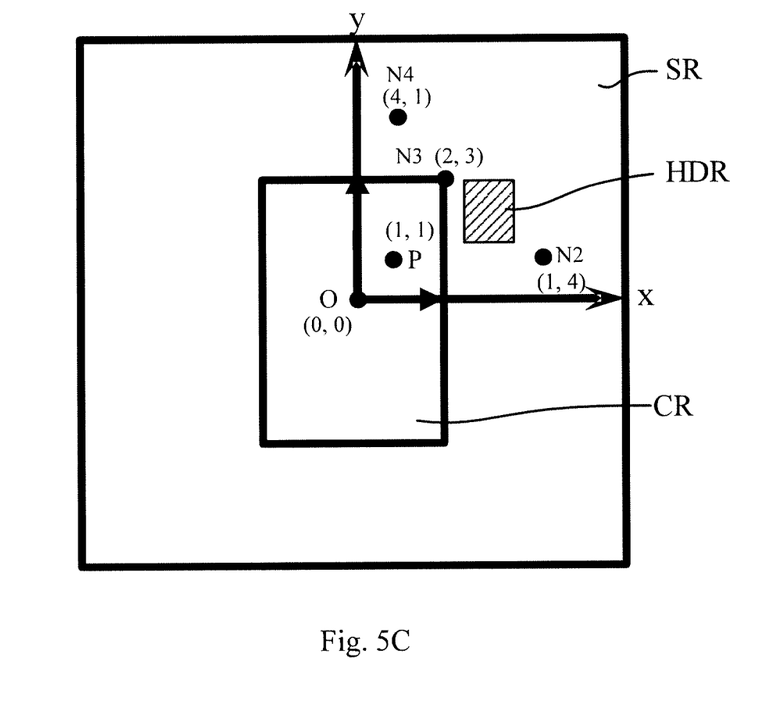

FIG. 5A to FIG. 5C show schematic diagrams of processing performed when positions of electronic cells moved by the extension module 24 are in a region having a high density of electronic cells. Suppose that a central square in FIG. 5A is a congestion region CR, a square on an outer side of the central square is a share region SR, O(0, 0) is an original point, an electronic cell is originally distributed on a position P(1, 1), and a hatched region represents a region HDR (high density region), having a high density of electronic cells, in a share region SR.

Referring to FIG. 5B, a position N1(3, 2) where the electronic cell is moved to is calculated as being unfortunately in the region HDR. In the event that the extension module 24 actually moves the electronic cell to the position N1(3, 2), the density of electronic cells of the region HDR is increased, so that the motion will be determined as being infeasible. In view of the foregoing issues, a solution that determines other replacement motion points via a "Manhattan" distance calculation is provided in the present invention. According to the Manhattan distance calculation, a distance between two points is a sum of absolute differences in axes of a standard coordinate system of the two points.

Referring to FIG. 5C, since a Manhattan distance between the position N1(3, 2) and the original position P(1, 1) is equal to 3 (i.e., (3−1)+(2−1)=3), other replacement motion points N2(1, 4), N3(2, 3) and N4(4, 1) different from N1(3, 2) can be obtained according to the position P(1, 1) and the Manhattan distance 3. Since the replacement motion points N2(1, 4), N3(2, 3) and N4(4, 1) are not in the high density region HDR, the extension module 24 moves the electronic cell to the position N2(1, 4), N3(2, 3) or N4(4, 1) without creating a problem that the density of electronic cells in the region HDR is increased.

In practical applications, a user may not wish to extend all electronic cells in the congestion region CR by the extension module 24, i.e., the user may wish to only move a portion of electronic cells in the congestion region CR. In such a case, the user may define via the determining module 26 which ones of the electronic cells in the congestion region CR are to be re-arranged and which ones of the electronic cells in the congestion region CR are to remain or stay unchanged, i.e., which ones are not to be moved.

Figure 6A:
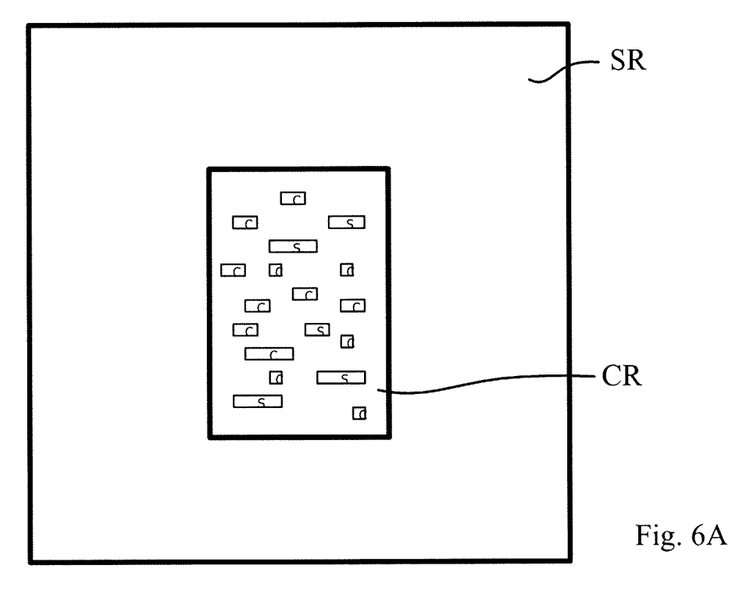
FIG. 6A and FIG. 6B are schematic diagrams of an arrangement of moving combination cells on a circuit layout by an extension module while sequential cells stay unmoved.
Figure 6B:
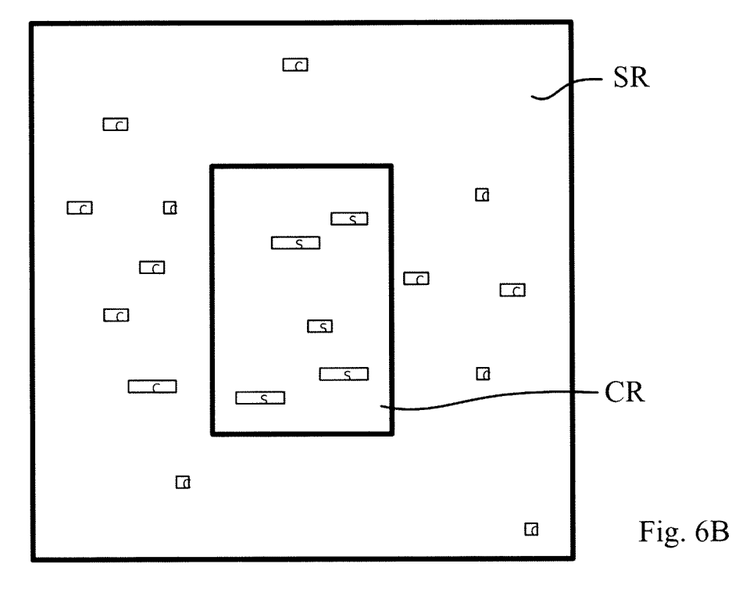

For example, referring to FIG. 6A, suppose that a plurality of combination cells c (e.g., OR gates and NAND gates), a plurality of sequential cells s (e.g., flip-flops, latches and clock gates) are contained in the congestion region CR of the circuit layout. In order to maintain a clock behavior of insertion delay of the circuit layout, the user defines via the determining module 26 that only the combination cells c are to be moved, so that the extension module 24 only extends the combination cells c according to such definition while positions of all sequential cells s stay unchanged, as shown in FIG. 6B.

Figure 7A:
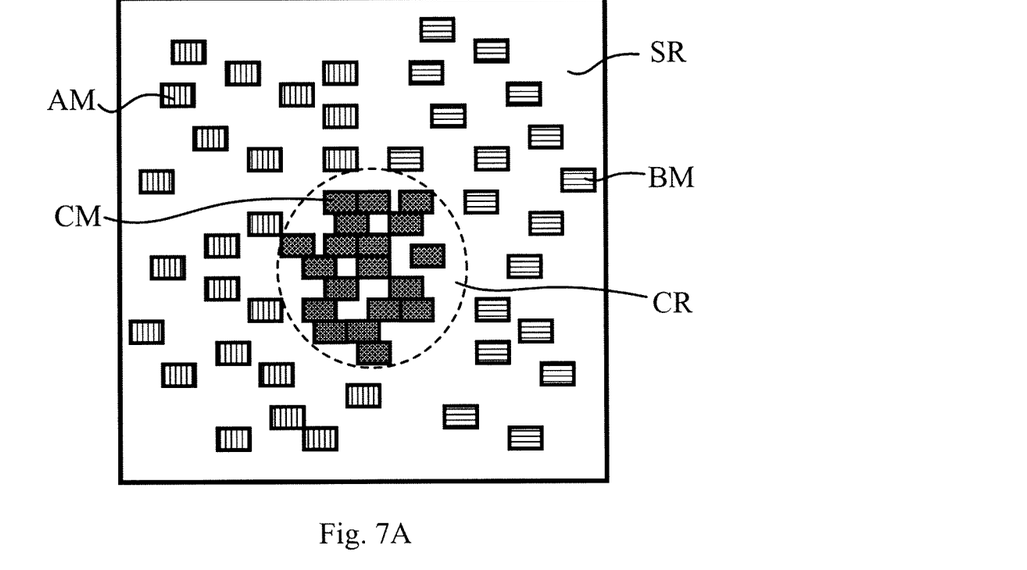
FIG. 7A and FIG. 7B are schematic diagrams of an arrangement of only moving by an extension module one type of electronic cells on a circuit payout.
Figure 7B:
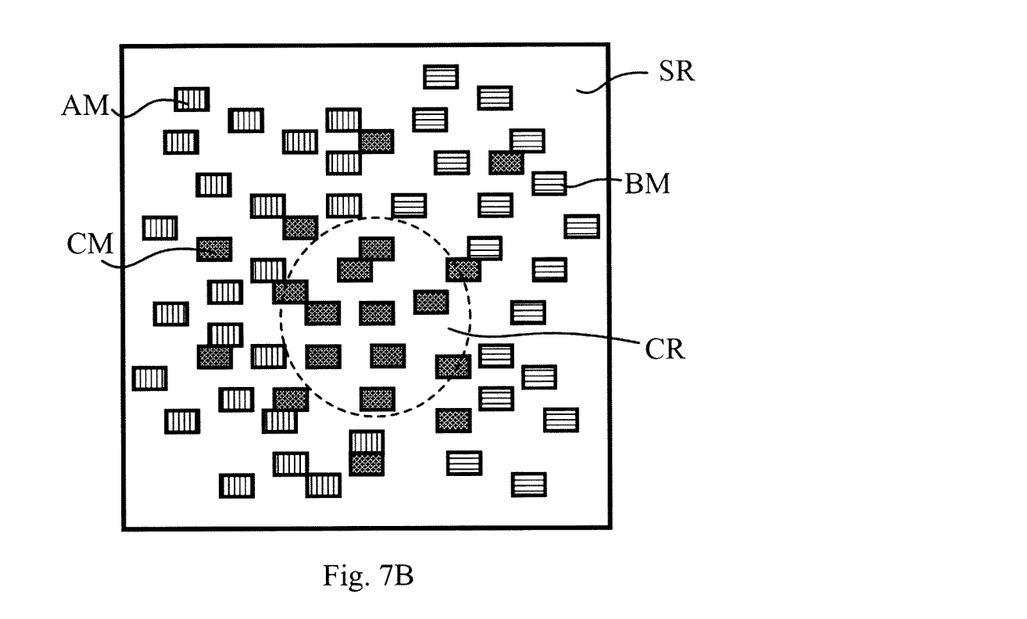

In addition, referring to FIG. 7A, suppose that the circuit layout comprises three types of electronic cell modules, of which only electronic cell modules CM are in a congestion state that electronic cells are un-routable, and of which the other two types of electronic cell modules AM and BM are in a routing or routable state. At this point, the user can define via the determining module 26 that only the electronic cell modules CM are to be moved, so that the extension module 24 only extends the electronic cell modules CM according to such definition while positions of the other types of electronic cell modules AM and BM stay unchanged, as shown in FIG. 7B.

Figure 8:
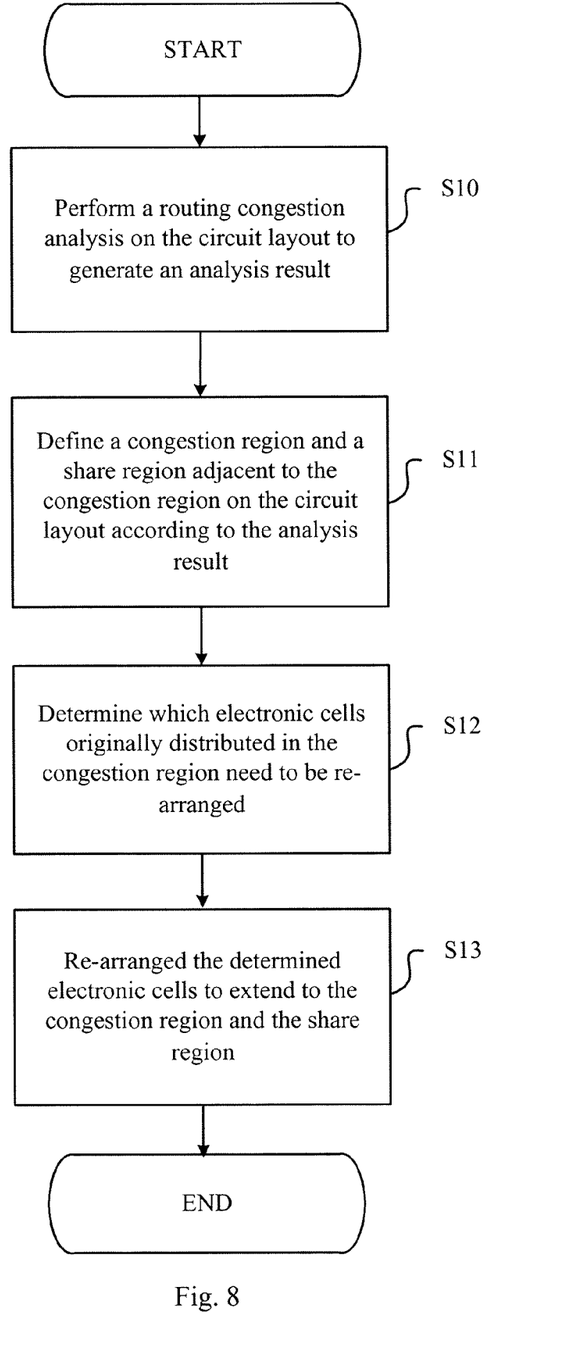
FIG. 8 is a flow chart of a congestive placement preventing method in accordance with a second embodiment of the present invention.

According to a second embodiment of the present invention, a congestive placement preventing method is applied to a circuit layout that comprises a plurality of electronic cells. FIG. 8 shows a flow chart of the congestive placement preventing method in accordance with the second embodiment of the present invention.

The flow begins with Step S10 in which a routing congestion analysis is performed on the circuit layout to generate an analysis result. The flow proceeds to Step S11 in which a congestion region and a share region adjacent to the congestion region on the circuit layout are defined according to the analysis result. In practice, forms of the congestion region and the share region are determined according to an aspect ratio factor to be circles, ellipses, squares, rectangles or other forms.

In this embodiment, the share region comprises a first share region and a second share region. By regarding the congestion region as a center, the congestion region, the first share region and the second share region are in sequence arranged from the inside out.

In Step S12, it is determined which electronic cells originally distributed in the congestion region need to be re-arranged. In Step S13, the determined electronic cells are re-arranged to extend to the congestion region and the share region. It is to be noted that, when the electronic cells are re-arranged in Step S13, relative position relationships among all electronic cells on the circuit layout stay unchanged.

For example, an electronic cell originally distributed in a first position of the congestion region is extended to a second position of the congestion region or the first share region according to a value associated with a first extension ratio, and the second position is calculated according to a center point of the congestion region, the first position and the value associated with the first extension ratio. In practical applications, the value associated with the first extension ratio is associated with a distance between a center point and a boundary of the congestion region and a distance between the center point of the congestion region and a boundary of the first share region. Calculations for the second position are made based on the foregoing Equation 1 to Equation 3, and shall not be described for brevity.

In addition, in the share region, an electronic cell originally distributed on a third position of the first share region is re-arranged according to a value associated with a second extension ratio so as to be extended to a fourth position of the second share region, and the electronic cell is limited to the second share region. The fourth position is calculated according to the center point of the congestion region, the third position and the value associated with the second extension ratio. In practice, the value associated with the second extension ratio is associated with a distance between the center point of the congestion region and the boundary of the second share region, a distance between the center point of the congestion region and the boundary of the first share region, the distance between the center point and the boundary of the congestion region, and a distance between the center point of the congestion region and the third position. Calculations for the fourth position are made based on the foregoing Equation 4 to Equation 6, and shall not be described for brevity.

Compared to the prior art, the congestive placement preventing apparatus and method thereof provided by the present invention is capable of extending electronic cells in a congestion region of the circuit layout to an adjacent region comprising electronic cells having a low density to reduce a density of electronic cells of the congestion region that becomes a routable region. Accordingly, the densities of the electronic cells in the congestion region and the share region can become more uniform. Further, due to processing of the congestive placement preventing apparatus and method thereof provided by the present invention, relative positions of the electronic cells of the circuit layout stays unchanged, so that the circuit layout can satisfy a time constraint. Moreover, the congestion region is removed without generating any additional area penalty.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A congestive placement preventing apparatus, for modifying a circuit layout, the apparatus comprising:
   at least one processor and a storage medium, the storage medium configured to store instructions which, when executed by the at least one processor, cause the at least one processor to:
   perform a congestion analysis on the circuit layout to generate an analysis result;
   define a congestion region and a share region adjacent to the congestion region on the circuit layout according to the analysis result wherein the congestion region includes electronic cells; and
   arrange the electronic cells in the congestion region to the congestion region and the share region,
   wherein the instructions further cause the at least one processor to extend and arrange the electronic cells in the congestion region to the congestion region and the share region, so as to reduce a density of electronic cells in the congestion region,
   wherein when the density of electronic cells in the congestion region is reduced to a predetermined value, the congestion region becomes a routable region in the congestion analysis performed by the analysis module,
   wherein the share region comprises a first share portion and a second share portion, and the congestion region, the first share portion and the second share portion are in sequence arranged from the inside out by regarding the congestion region as a center, and
   wherein the instructions further cause the at least one processor to extend an electronic cell at a first position of the congestion region to a second position in the congestion region or the first share portion according to a first extension ratio, and the second position is calculated according to a center point of the congestion region, the first position and the first extension ratio.

2. The congestive placement preventing apparatus as claimed in claim 1, wherein the instructions further cause the at least one processor to:
   determine which electronic cells originally distributed in the congestion region need to be arranged.

3. The congestive placement preventing apparatus as claimed in claim 1, wherein the first extension ratio is associated with a distance between the center point of the congestion region and a boundary of the congestion region, and a distance between the center point of the congestion region and a boundary of the first share portion.

4. The congestive placement preventing apparatus as claimed in claim 1, wherein the instructions further cause the at least one processor to extend an electronic cell at a third position of the first share portion to a fourth position of the second share portion according to a second extension ratio, and the fourth position is calculated according to a center point of the congestion region, the third position and the second extension ratio.

5. The congestive placement preventing apparatus as claimed in claim 4, wherein the second extension ratio is associated with a distance between the center point of the congestion region and a boundary of the second share portion, a distance between the center point of the congestion region and a boundary of the first share portion, a distance between the center point of the congestion region and a boundary of the congestion region, and a distance between the center point of the congestion region and the third position.

6. The congestive placement preventing apparatus as claimed in claim 1, wherein a density of the electronic cells in the congestion region is higher than that of electronic cells in the share region.

7. A method for preventing congestive placement, for modifying a circuit layout, the method comprising:
   performing, using an analysis module operating in a computer, a congestion analysis on the circuit layout to generate an analysis result;
   defining, using a defining module operating in a computer, a congestion region and a share region adjacent to the congestion region on the circuit layout according to the analysis result, wherein the congestion region includes electronic cells; and
   arranging the electronic cells in the congestion region to the congestion region and the share region,
   wherein the step of arranging the electronic cells comprises extending the electronic cells in the congestion region to the congestion region and the share region, so as to reduce a density of electronic cells in the congestion region, and
   wherein when the density of electronic cells in the congestion region is reduced to a predetermined value, the congestion region becomes a routable region in the congestion analysis
   wherein the share region comprises a first share portion and a second share portion, and the congestion region, the first share portion and the second share portion are in sequence arranged from the inside out by regarding the congestion region as a center, and
   wherein an electronic cell on a first position of the congestion region is extended to a second position in the congestion region or the first share portion according to a first extension ratio, and the second position is calculated according to a center point of the congestion region, the first position and the first extension ratio.

8. The method as claimed in claim 7, further comprising: determining which electronic cells distributed in the congestion region are to be arranged.

9. The method as claimed in claim 7, wherein the first extension ratio is associated with a distance between the center point of the congestion region and a boundary of the congestion region, and a distance between the center point of the congestion region and a boundary of the first share portion.

10. The method as claimed in claim 7, wherein an electronic cell on a third position of the first share portion is extended to a fourth position in the second share portion according to a second extension ratio, and the fourth position is calculated according to a center point of the congestion region, the third position and the second extension ratio.

11. The method as claimed in claim 10, wherein the second extension ratio is associated with a distance between the center point of the congestion region and a boundary of the second share portion, a distance between the center point of the congestion region and a boundary of the first share portion, a distance between the center point of the congestion region and a boundary of the congestion region, and a distance between the center point of the congestion region and the third position.

12. The method as claimed in claim 7, wherein a density of the electronic cells in the congestion region is higher than that of electronic cells in the share region.

* * * * *